(12) United States Patent
Tsai et al.

(10) Patent No.: US 8,012,846 B2
(45) Date of Patent: Sep. 6, 2011

(54) ISOLATION STRUCTURES AND METHODS OF FABRICATING ISOLATION STRUCTURES

(75) Inventors: Cheng-Yuan Tsai, Chu-Pei (TW); Chih-Lung Lin, Taipei (TW); Cheng-Chen Calvin Hsueh, Linkou (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 206 days.

(21) Appl. No.: 11/462,571

(22) Filed: Aug. 4, 2006

(65) Prior Publication Data

US 2008/0032482 A1    Feb. 7, 2008

(51) Int. Cl.
*H01L 21/76* (2006.01)

(52) U.S. Cl. .... 438/424; 438/435; 438/437; 257/E21.54

(58) Field of Classification Search ................... 438/437, 438/424, 435; 257/E21.54
See application file for complete search history.

(56) References Cited

U.S. PATENT DOCUMENTS

| | | | | |
|---|---|---|---|---|
| 5,719,085 A * | 2/1998 | Moon et al. | | 438/424 |
| 5,741,740 A * | 4/1998 | Jang et al. | | 438/435 |
| 6,037,018 A * | 3/2000 | Jang et al. | | 427/579 |
| 6,100,163 A | 8/2000 | Jang et al. | | |
| 6,140,208 A * | 10/2000 | Agahi et al. | | 438/437 |
| 6,143,625 A * | 11/2000 | Chen et al. | | 438/435 |
| 6,180,493 B1 * | 1/2001 | Chu | | 438/437 |
| 6,207,532 B1 | 3/2001 | Lin et al. | | |
| 6,297,128 B1 * | 10/2001 | Kim et al. | | 438/437 |
| 6,521,509 B2 * | 2/2003 | Teramoto et al. | | 438/424 |
| 6,589,853 B2 * | 7/2003 | Kumamoto | | 438/424 |
| 6,828,239 B2 | 12/2004 | En-Ho et al. | | |
| 7,319,062 B2 * | 1/2008 | Hong | | 438/437 |
| 7,429,520 B2 * | 9/2008 | Song et al. | | 438/435 |
| 2002/0081817 A1 | 6/2002 | Bhakta et al. | | |
| 2002/0106864 A1 | 8/2002 | Chen et al. | | |
| 2003/0207591 A1 * | 11/2003 | Lu et al. | | 438/770 |
| 2004/0115897 A1 * | 6/2004 | Inoue et al. | | 438/424 |
| 2005/0054176 A1 * | 3/2005 | Jung | | 438/437 |
| 2005/0255669 A1 * | 11/2005 | Kang et al. | | 438/437 |
| 2006/0105541 A1 * | 5/2006 | Inoue | | 438/452 |
| 2007/0210403 A1 * | 9/2007 | Sandhu | | 257/499 |
| 2007/0249128 A1 * | 10/2007 | Kim et al. | | 438/296 |
| 2008/0061379 A1 * | 3/2008 | Chen et al. | | 257/382 |
| 2008/0182383 A1 * | 7/2008 | Lee et al. | | 438/437 |
| 2008/0188057 A1 * | 8/2008 | Youn et al. | | 438/437 |

OTHER PUBLICATIONS

Office Action dated Sep. 19, 2008 in corresponding Chinese Application No. 2007100022744.
Office Action dated Jul. 31, 2009 in corresponding Chinese Application No. 2007100022744.

* cited by examiner

*Primary Examiner* — Charles D Garber
*Assistant Examiner* — Angel Roman
(74) *Attorney, Agent, or Firm* — Duane Morris LLP

(57) ABSTRACT

A method of forming an isolation structure includes the steps of: (a) forming an opening within a substrate; (b) forming a substantially conformal layer comprising tetraethoxysilane (TEOS) layer along the opening; and (c) forming a dielectric layer over the TEOS layer, the dielectric layer substantially filling the opening.

16 Claims, 8 Drawing Sheets

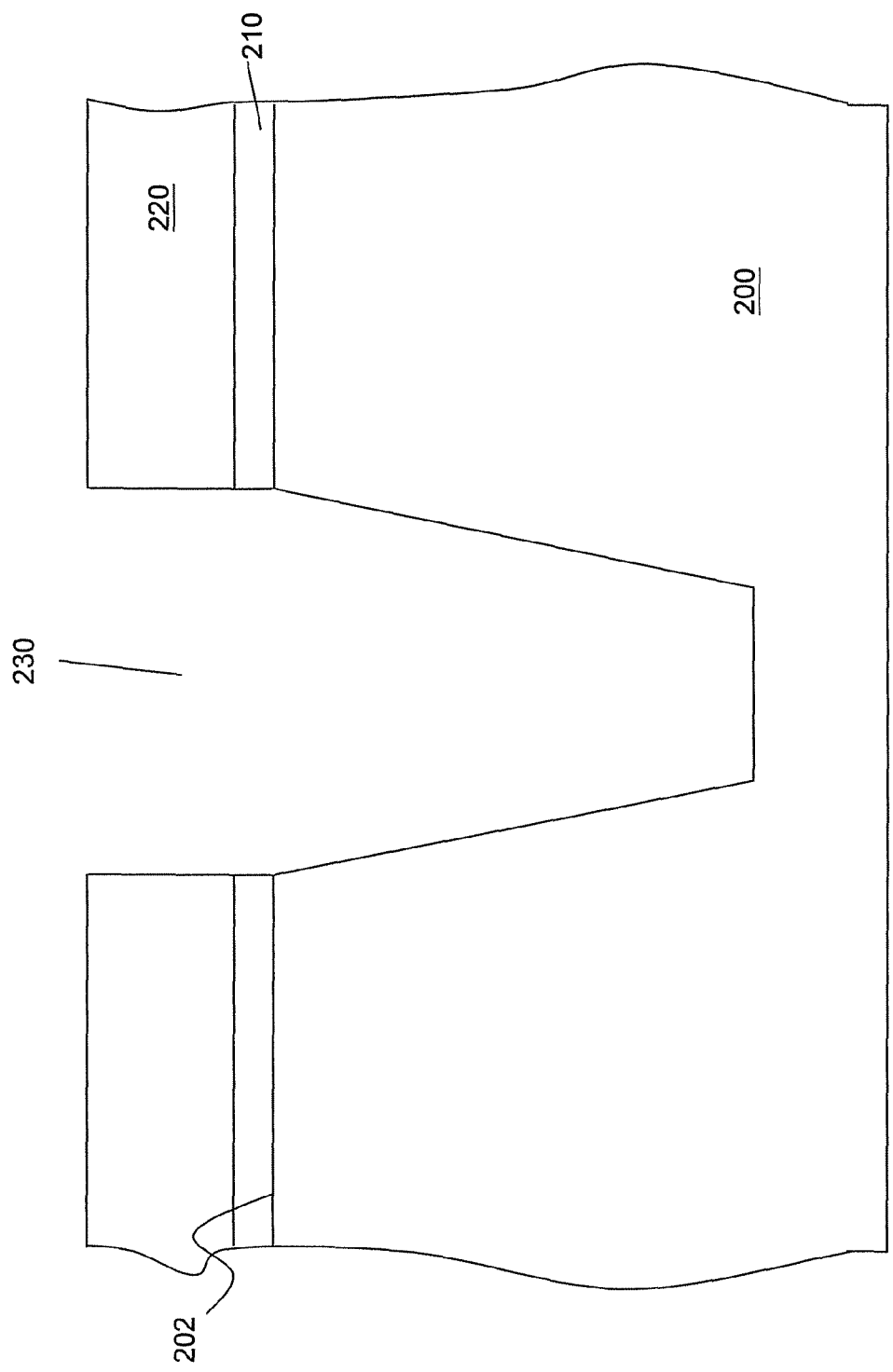

ISOLATION STRUCTURES AND METHODS OF FABRICATING ISOLATION STRUCTURES

BACKGROUND OF THE INVENTION

1. Field of the Invention

The present invention relates to semiconductor structures and methods of forming semiconductor structures, and more particularly to isolation structures and methods of fabricating isolation structures.

2. Description of the Related Art

With advances associated with electronic products, semiconductor technology has been widely applied in manufacturing memories, central processing units (CPUs), liquid crystal displays (LCDs), light emission diodes (LEDs), laser diodes and other devices or chip sets. In order to achieve high-integration and high-speed goals, dimensions of semiconductor integrated circuits continue to shrink. Various materials and techniques have been proposed to achieve these integration and speed goals and to overcome manufacturing obstacles associated therewith. Due to high integration, electrical isolation between adjacent devices or circuits has increased in importance. To that end, shallow trench isolation (STI) structures have been used in this art.

FIGS. 1A-1B are schematic cross-sectional views showing a prior art process for removing a pad oxide layer formed over a substrate.

More specifically, FIG. 1A shows a shallow trench isolation structure in which a pad nitride layer has been removed. The prior art structure comprises a pad oxide layer 110 formed over the substrate 100. An opening (not shown) is formed within the pad oxide layer 110 and substrate 100. A substantially conformal liner layer 120 is formed within the opening. A high density plasma chemical vapor deposition (HDP CVD) oxide layer 130 is then formed within the opening, thereby filling the opening and forming a STI structure.

In the prior art process for the formation of the HDP CVD oxide 130, initially a thin region 130a of the HDP CVD oxide 130 is formed by a HDP CVD process without turning on bias power for bombardment before the formation of the bulk of the HDP CVD oxide layer 130. The thin region 130a must be form substantially conformal over the liner layer 120 without changing the profile of the opening so as to avoid difficulty of bulk filling. This region is illustrated by dashed lines. The process for the formation of the thin region 130a of the HDP CVD oxide layer 130 does not use a processing bias due to concern that ions of the HDP CVD process may bombard the liner layer 120 formed at the corners of the top surface 102 of the substrate 100 and the opening. The ion bombardment will adversely affect physical characteristics, e.g., density or thickness, of the liner layer 120 at the corners of the top surface 102 of the substrate 100. The thin region 130a of the HDP CVD oxide layer 130 is, therefore, less dense than the bulk of the HDP CVD oxide layer 130, which is formed by a HDP CVD process with a processing bias, and the pad oxide layer 110, which is formed by a thermal oxidation process.

As shown in FIG. 1B, an oxide wet etch process is then performed to remove the pad oxide layer 110. The oxide wet etch also removes portions of the liner layer 120 and the HDP CVD oxide layer 130. The remaining liner layer 120a and/or HDP CVD oxide layer 130b extend slightly over the top surface 102 of the substrate 100. As described above, the thin region 130a of the HDP CVD oxide layer 130b is less dense than the bulk of the HDP CVD oxide layer 130b and the pad oxide layer 110. The oxide wet etch process, therefore, etches the thin region 130a of the HDP CVD oxide layer 130b faster than it does the high density region, resulting in divots 140 proximate to the top surface of the thin region 130a and between the bulk of the HDP CVD oxide layer 130b and the liner layer 120a as shown in FIG. 1B. The divots can adversely affect physical profiles and/or electrical properties of the devices or circuits to be formed over the substrate 100. For example, a polysilicon layer (not shown) provided to form a transistor gate (not shown) is formed over the substrate 100 by a subsequent CVD process, filling into the divots 140. During the definition of the transistor gate, the polysilicon layer formed within the divots 140 may not be completely removed, resulting in an electrical short between two adjacent devices or circuits.

By way of background, U.S. Pat. No. 6,207,532 provides a description of methods of forming STI structures, the entirety of which is hereby incorporated by reference herein. Also, U.S. Patent Publication No. 2002/0106864 provides a description of methods for filling of a STI structure, the entirety of which is also hereby incorporated by reference herein.

From the foregoing, improved STI structures and methods of forming STI structures are desired.

SUMMARY OF THE INVENTION

In accordance with some exemplary embodiments, a method of forming an isolation structure comprises the steps of: (a) forming an opening within a substrate; (b) forming a substantially conformal layer comprising tetraethoxysilane (TEOS) layer along the opening; and (c) forming a dielectric layer over the TEOS layer, the dielectric layer substantially filling the opening.

In accordance with some exemplary embodiments, an isolation structure comprises a substantially conformal layer comprising tetraethoxysilane (TEOS) layer formed along an opening formed in a substrate. The isolation structure further comprises a dielectric layer formed over the TEOS layer and the dielectric layer substantially fills the opening.

The above and other features of the present invention will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

FIGS. 2A-2F are schematic cross-sectional views of a process for formation of an exemplary shallow trench isolation structure.

DESCRIPTION OF THE PREFERRED EMBODIMENT

Figure 1A:
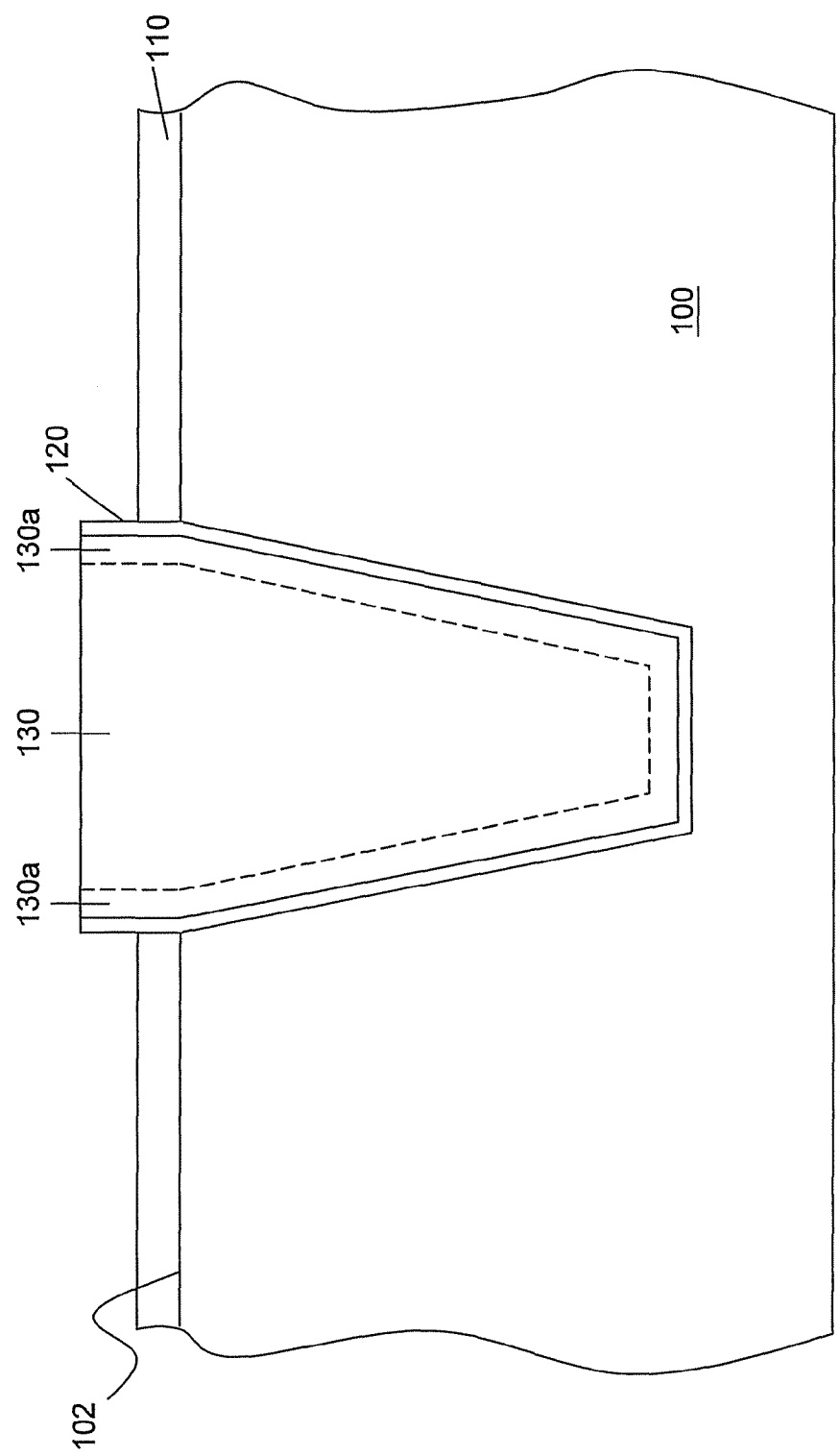
FIGS. 1A-1B are schematic cross-sectional views showing a prior art process for removing a pad oxide layer formed over a substrate.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIGS. 2A-2F are schematic cross-sectional views of a process for formation of an exemplary shallow trench isolation structure.

A pad oxide layer 210 is formed over a substrate 200. A pad nitride layer 220 is formed over the pad oxide layer 210. As shown in FIG. 2A, an opening 230 is formed through the pad oxide layer 210, pad nitride layer 220 and within the substrate 200. The substrate 200 can be a silicon substrate, III-V compound substrate, display substrate such as a liquid crystal display (LCD), plasma display, cathode ray tube display or electro luminescence (EL) lamp display, or light emitting diode (LED) substrate (collectively referred to as, substrate 200), for example. The pad oxide layer 210 can be formed, for example, by a thermal oxidation process or chemical vapor deposition (CVD) process. The pad nitride layer 220 can be formed, for example, by a CVD process.

A photoresist layer (not shown) including an opening formed therein corresponding to the opening 230 is formed over the layer of nitride. The patterned photoresist layer can be formed by a photolithographic process. An etch process is then performed to sequentially remove portions of the layers of nitride and oxide to partially expose a top surface 202 of the substrate 200, defining the pad oxide layer 210 and pad nitride layer 220. After the etch process, the patterned photoresist is removed by a photoresist removal process, for example. Another etch process is performed to partially remove the substrate 200 to form the opening 230 as shown in FIG. 2A, using the patterned pad nitride layer 220 as a hard mask. For some embodiments using 90-nm technology, the opening 230 has a width of about 90 nm at the top surface 202 of the substrate 200 and a depth of about 3,800 Å from the top surface 202 of the substrate 200 to the bottom surface of the opening 230.

Figure 2B:
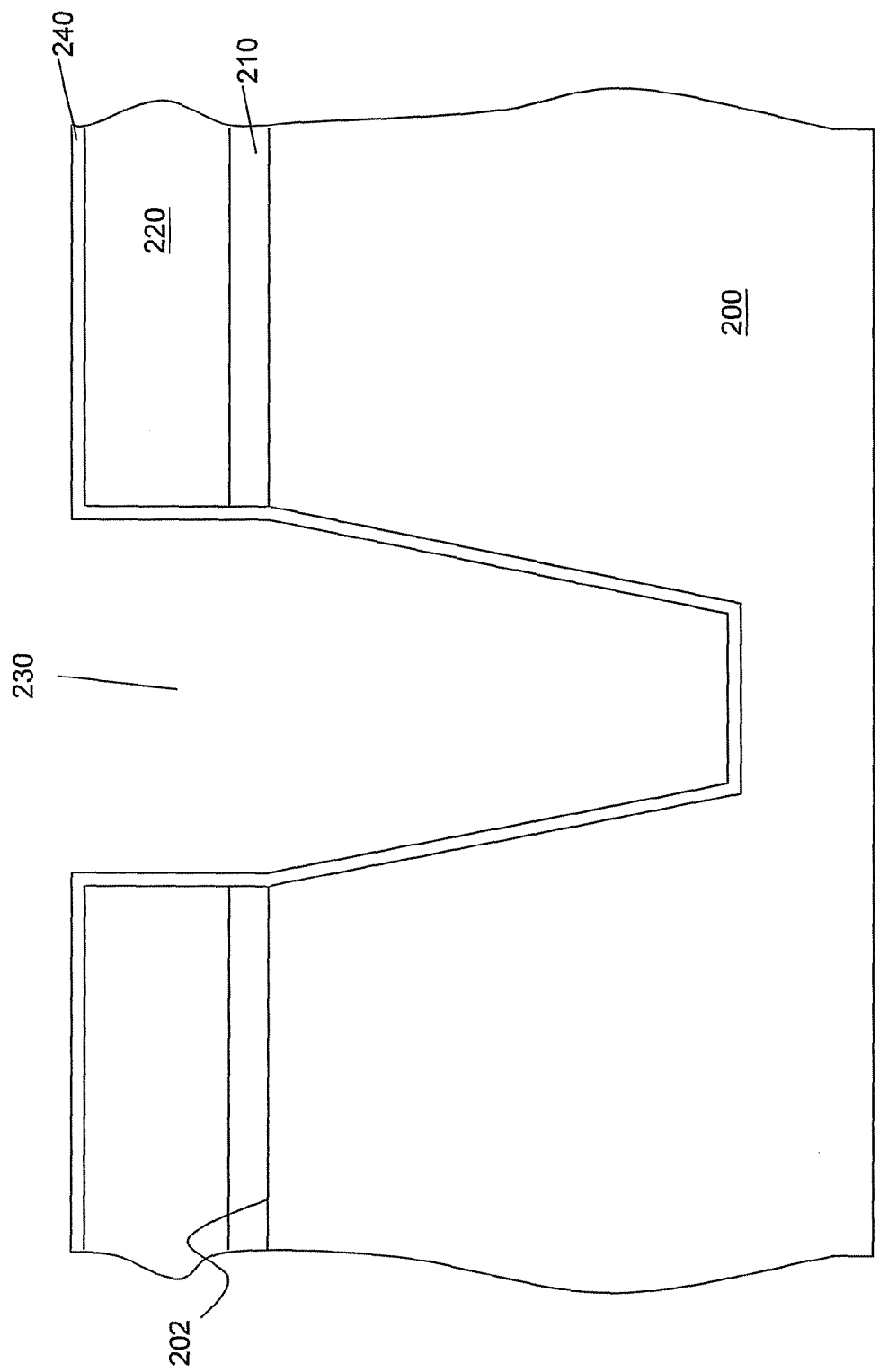

As shown in FIG. 2B, a liner layer 240 is formed substantially conformal over the substrate 200, including along the walls of the opening 230 and over the pad nitride layer 220. The liner layer 240 is a dielectric layer (e.g., an oxide layer, nitride layer, oxynitride layer or combination thereof) which is formed by a thermal oxidation process or CVD process. For embodiments using 90-nm technology, the liner layer 240 may have a thickness of about 100 Å. In some embodiments, the liner layer 240 is provided for rounding corners at the top surface 202 of the substrate 200 and the opening 230 and/or for reducing damage on the surface of the opening 230 created by the opening-etch process as set forth above. In some embodiments, the liner layer 240 is not used.

After the formation of the liner layer 240, an anneal process is performed to increase the density of the liner layer 240 and/or to remove or reduce damage to the surface of the opening 230 caused by the etch process used in forming the opening 230. The anneal process can thermally cure the damage on the surface of the opening 230. The anneal process can be performed, for example, by a furnace, a rapid thermal process (RTP) system or other thermal system that is able to provide a thermal treatment for the liner layer 240 to obtain a desired film quality. In some embodiments, the liner anneal process is performed with a processing temperature of about 1,100° C. for about 1~2 hours in an environment containing nitrogen, inert gas or other gas that will not substantially react with the liner layer 240.

Figure 2C:
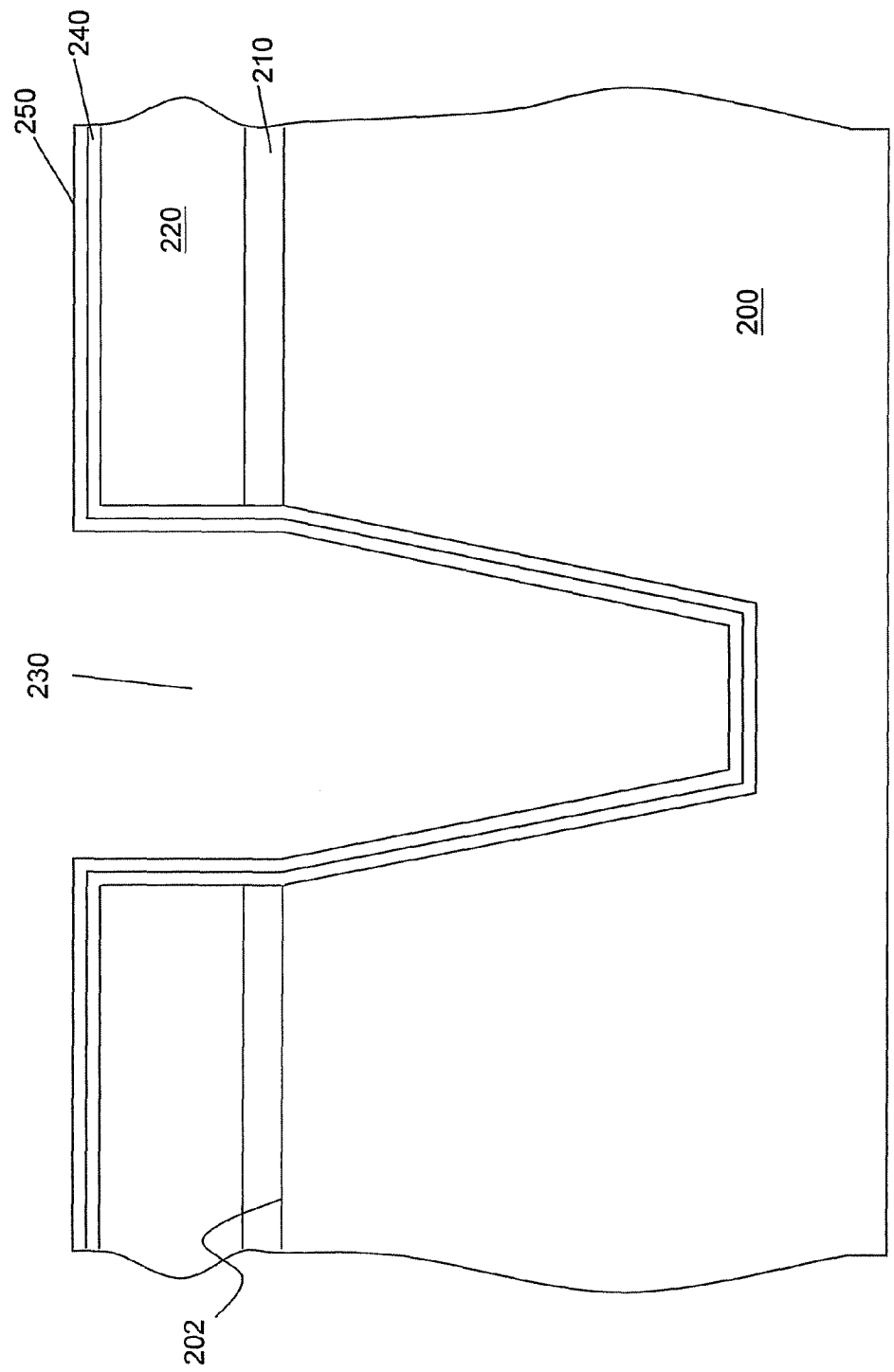

As shown in FIG. 2C, a second dielectric layer 250, such as a tetraethoxysilane (TEOS) layer 250, preferably $O_3$-TEOS layer, is formed substantially conformal over the structure of FIG. 2B, i.e., along the walls of the opening 230 and over the liner layer 240. The TEOS layer 250 can be formed, for example, by a sub-atmospheric pressure CVD (SACVD) process, plasma enhanced CVD (PECVD) process or atmospheric pressure CVD (APCVD) process. Because more reactants are provided and more chemical reactions occur, the use of APCVD process may enhance more particles formed over the substrate 200 or within a process chamber (not shown) in which the TEOS layer 250 is formed. The APCVD process is acceptable if particle formation is not a concern. The TEOS layer 250 is formed by a chemical reaction of reactants, such as $O_3$ and TEOS, $O_2$ and TEOS or other oxygen-containing gas and TEOS. In embodiments using a SACVD process, a processing pressure between about 300 mTorr and about 700 mTorr and a processing temperature between about 450° C. and between 600° C. may be used. Preferably, the processing pressure is about 600 mTorr and the processing temperature is about 550° C. In embodiments, the flow rate ratio of $O_3$ to TEOS is between about 2 to about 20. In some embodiments, the TEOS layer 250 is formed to a thickness between about 500 Å or less. More preferably, the TEOS layer 250 is formed to a thickness between about 50 Å to about 200 Å.

For some embodiments using a SACVD or APCVD process, the TEOS layer 250 is formed from chemical reactions of $O_3$ and TEOS without use of a processing bias. Accordingly, there are no concerns that ion bombardment will occur at the liner layer 240 at the corners of the top surface 202 of the substrate 200 and the opening 230. For other embodiments using a PECVD process, the TEOS layer 250 is formed from chemical reactions of $O_3$ and TEOS with or without a processing bias. Formation of the TEOS layer 250 by a PECVD reactor, including a self-bias and/or processing bias, is acceptable if ions accelerated by the bias will not substantially bombard the liner layer 240 at the corners of the top surface 202 of the substrate 200 and the opening 230.

In some embodiments, the TEOS layer 250 is formed before the liner anneal process set forth above. In these embodiments, the liner anneal process may also be used to increase the density of the TEOS layer 250. In other embodiments, a second anneal process is employed to densify the TEOS layer 250 in order to achieve a desired film quality of the TEOS layer 250. The TEOS anneal process can be performed, for example, in a furnace, a rapid thermal process (RTP) system or other thermal system that is capable of providing the desired film quality thereof. In some embodiments, the anneal process is performed at a processing temperature of at least about 1,000° C. for at least about 30 minutes in an environment containing nitrogen, inert gas or other gas that will not substantially react with the TEOS 250.

Figure 2D:
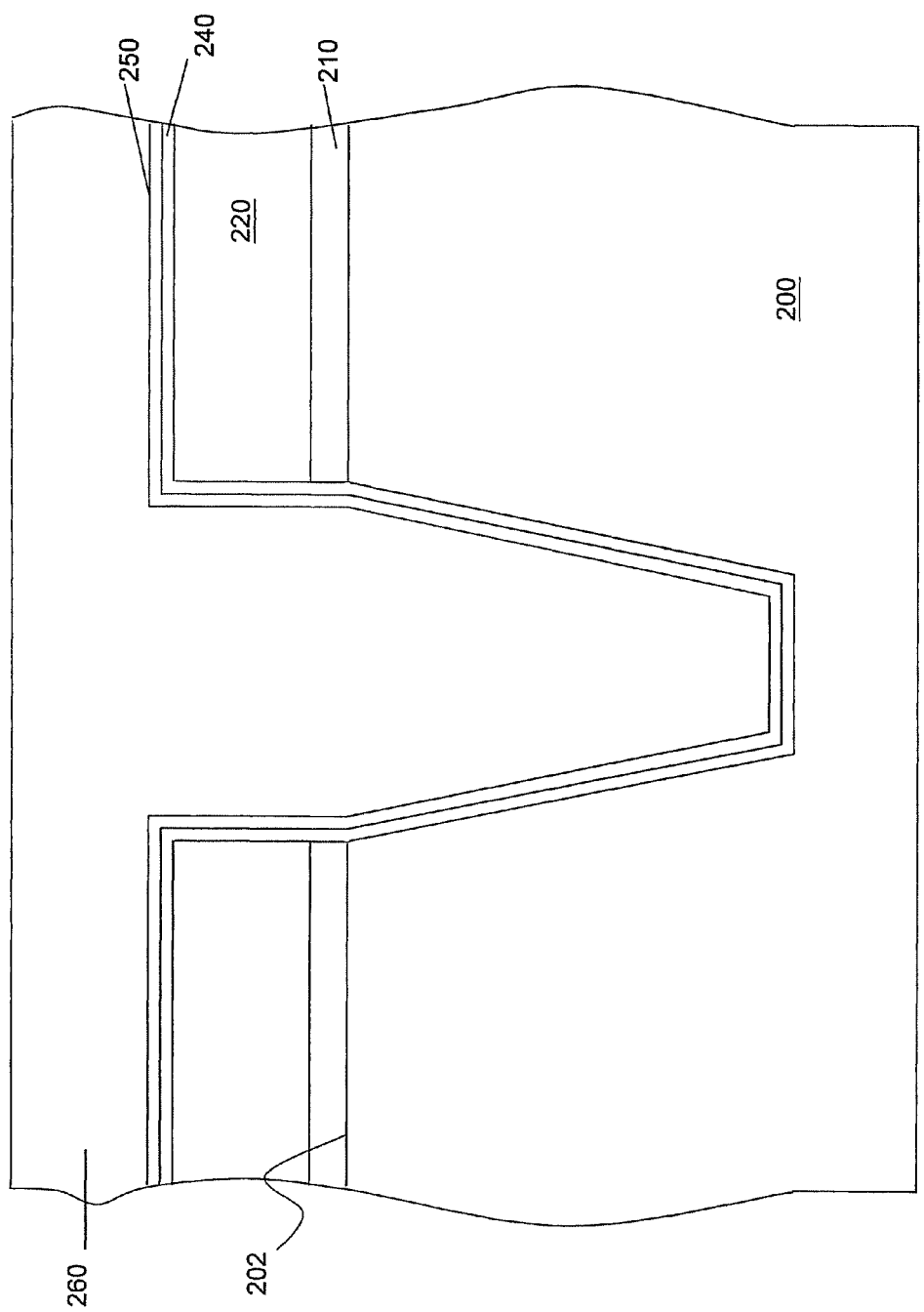

As shown in FIG. 2D, a dielectric layer 260 is formed over the TEOS layer 250, filling the opening 230. The dielectric layer 260 can be, for example, an oxide layer formed by a CVD process, such as SACVD process, APCVD process, PECVD process or high density plasma CVD (HDP CVD) process. In some embodiments, the dielectric layer 260 comprises a HDP CVD oxide layer. In other embodiments, the dielectric layer 260 comprises a sub-atmospheric undoped-silicon glass (SAUSG) layer. In these embodiments using a SAUSG layer, the flow rate ratio of $O_3$ to TEOS is between about 2 to about 20. Preferably, the flow rate ratio of $O_3$ to TEOS is about 5 or more. More preferably, the flow rate ratio of $O_3$ to TEOS is about 9 or more. In some embodiments using 90-nm technology, lower flow rate ratio of $O_3$ to TEOS (e.g., about 4) may result in a seam formed within the dielectric layer 260. If the top of the opening 230 closes before the opening 230 is completely filled, reactants $O_3$ and TEOS are trapped within the lower region between the dielectric layer 260 formed on both sidewalls of the openings 230. The flow rate ratio of $O_3$ to TEOS which may result in this seam in the dielectric layer 260, however, may depend on the aspect ratio (height/width) and shape of the opening 230. One of ordinary skill in the art, based on the description set forth above, can readily achieve a desired dielectric layer by adjusting the flow rate ratio of $O_3$ to TEOS.

Figure 1B:
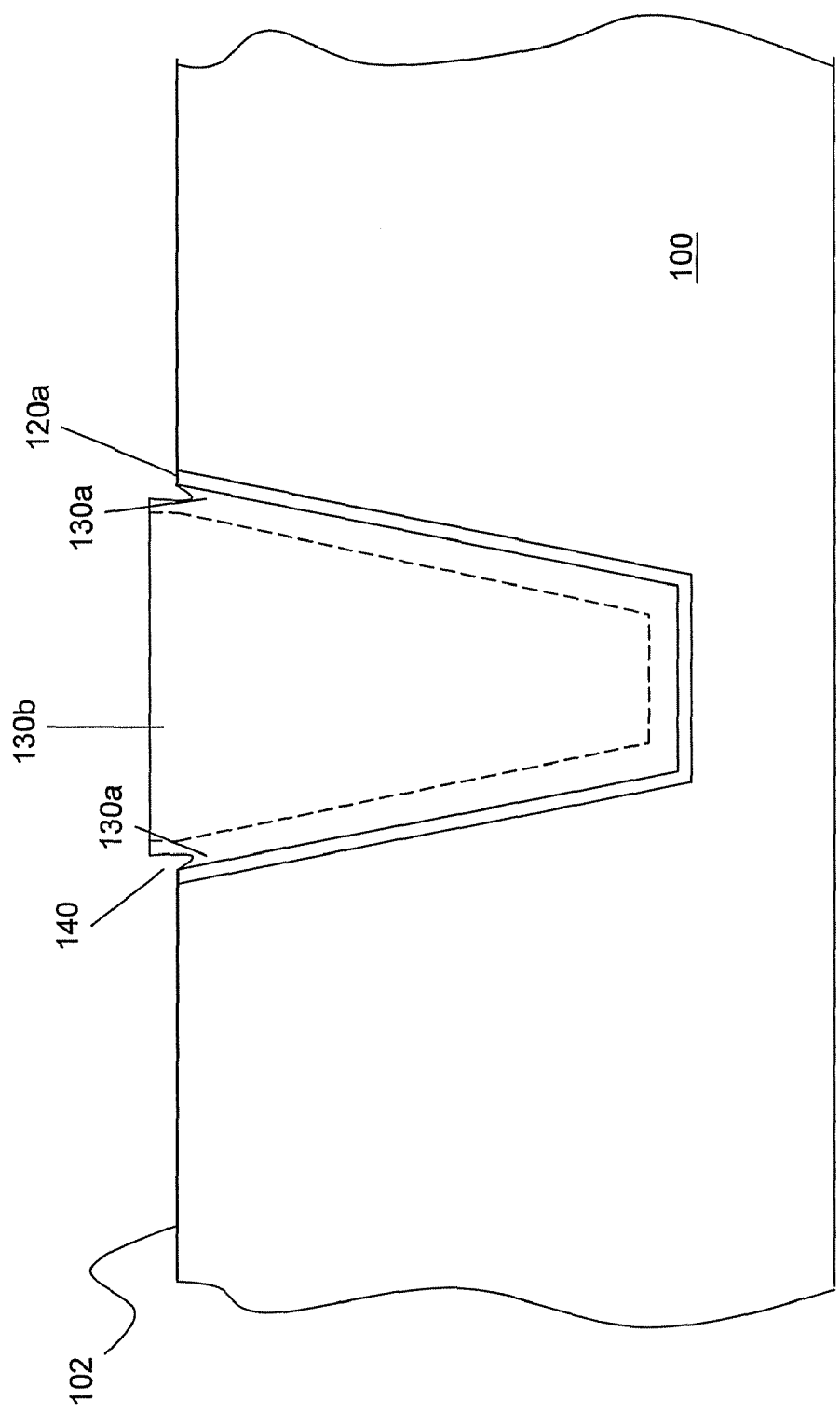

After the formation of the dielectric layer 260 within the opening 230, another anneal process is performed to increase the density of the dielectric layer 260. This anneal process may also improve the density of the TEOS layer 250. The anneal process can be performed, for example, in a furnace, a rapid thermal process (RTP) system or other thermal system that is adapted to provide a thermal treatment for the dielectric layer 260 to obtain a desired film quality. In some embodiments, the dielectric layer anneal process may be performed at about 1,000° C. for about 20 seconds in a RTP system in an environment containing nitrogen, an inert gas or other gas that will not substantially react with the dielectric layer 260. After these anneal processes (e.g., the liner anneal process, dielectric anneal process, TEOS anneal process or combination thereof) as set forth above, the TEOS layer 250 is denser and less susceptible to an oxide etch process, i.e., the oxide etch process has an etch rate with respect to the densified TEOS layer 250 that is lower than that of the HDP CVD layer 130a (shown in FIGS. 1A and 1B) formed without a processing bias. One of ordinary skill in the art, according to the descriptions of these embodiments, can readily achieve a desired film quality of the TEOS layer 250 by at least one of the anneal processes described above.

Figure 2E:
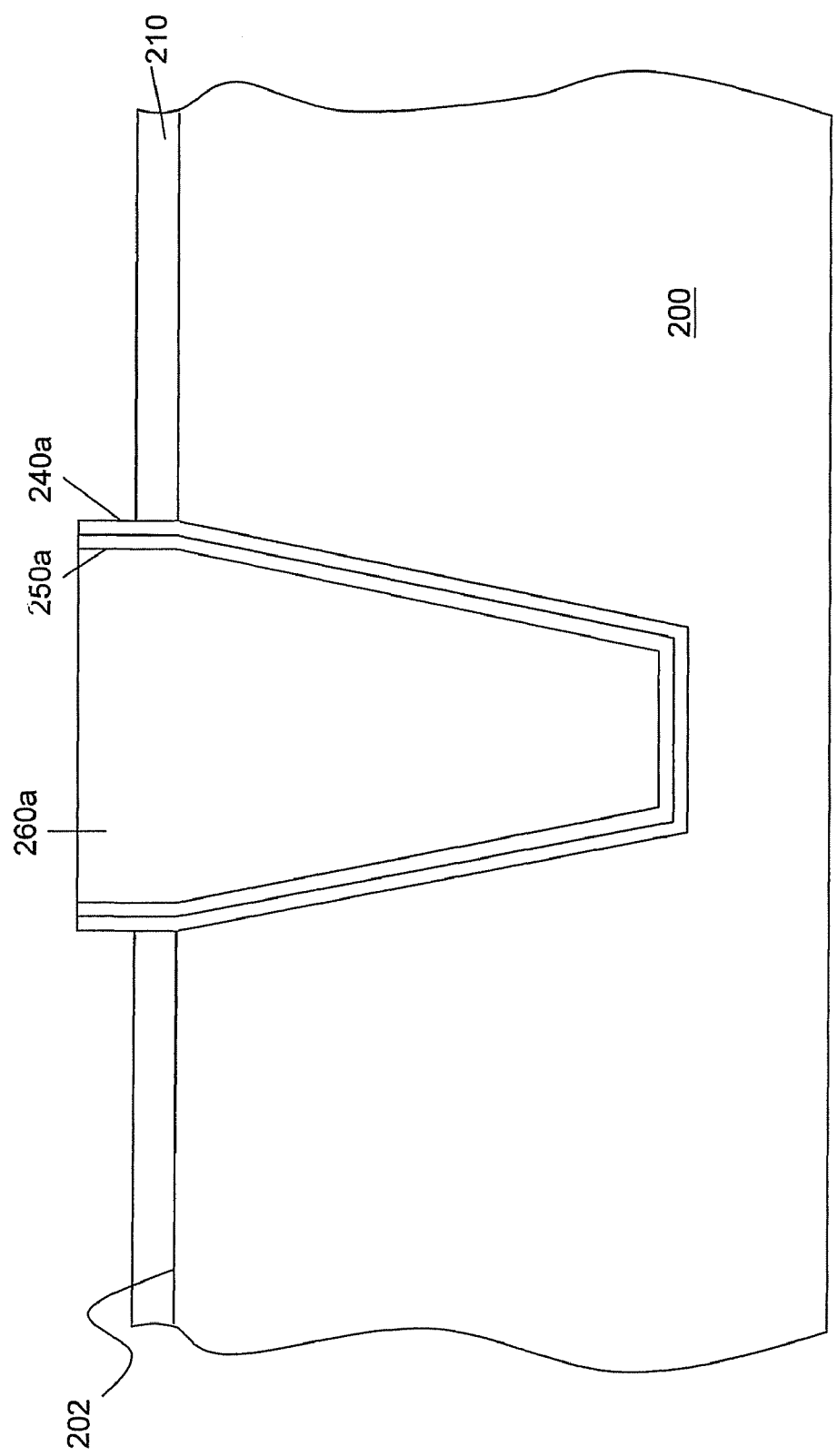

As shown in FIG. 2E, the pad nitride layer 220 and a portion of the dielectric layer 260 outside the opening 230 are removed. After the formation of the dielectric layer 260 shown in FIG. 2D, an etch-back process or chemical-mechanical polishing (CMP) process is performed to partially remove the dielectric layer 260, TEOS layer 250 and liner layer 240 over the top surface of the pad nitride layer 220 to expose the top surface of the pad nitride layer 220. A wet or dry etch process is then performed to remove the pad nitride layer 220. Because the etch process has higher etch selectivity for nitride than to oxide, such as the liner layer 240a, the etch process removes the pad nitride layer 220 faster than the dielectric layer 260, TEOS layer 250 and liner layer 240. Accordingly, the remaining dielectric layer 260a, TEOS layer 250a and liner layer 240a extend over the top surface of the pad oxide layer 210.

Figure 2F:
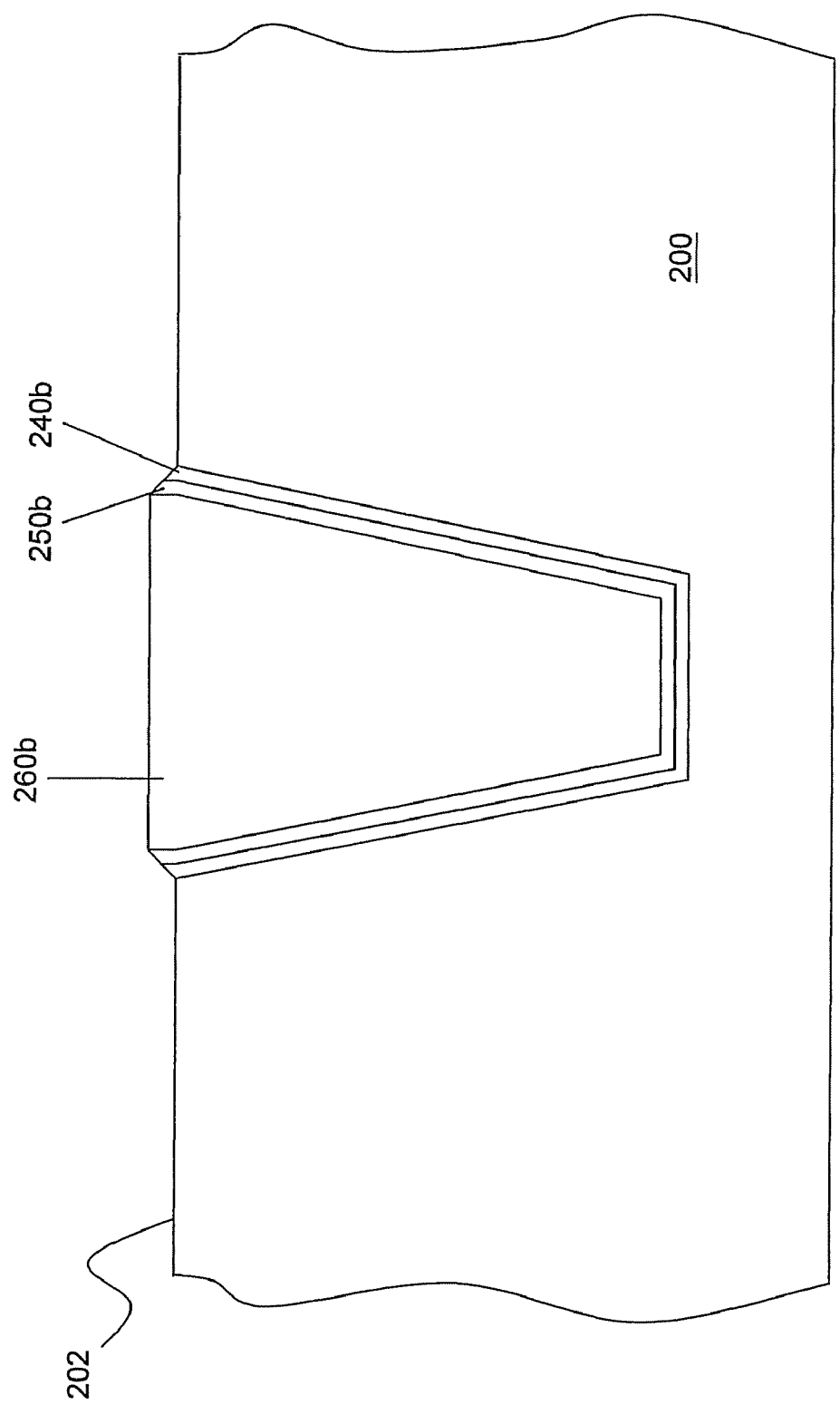

As shown in FIG. 2F, the pad oxide layer 210 and portions of the dielectric layer 260a, TEOS layer 250a and liner layer 240a extending above the top surface 202 of the substrate 200 are removed by a wet or dry etch process. In some embodiments, the remaining dielectric layer 260b, TEOS layer 250b and liner layer 240b extend slightly over or recess under the top surface 202 of the substrate 200 if such extension or recession will not result in substantially nonplanar top surface 202 of the substrate 200.

Though the densified TEOS layer 250b may be still more vulnerable to an oxide etch process than the liner layer 240b and pad oxide layer 210, the densified TEOS layer 250b is less susceptible to an oxide etch process than the HDP CVD layer 130a (shown in FIGS. 1A and 1B) formed without a processing bias. The etch process for removing the pad oxide layer 210 will not substantially remove the TEOS layer 250b formed between the liner layer 240b and the dielectric layer 260b. The densified TEOS layer 250b, therefore, can effectively reduce or prevent occurrence of divots at the top surface of the TEOS layer 250b and between the liner layer 240b and the dielectric layer 260b. In some embodiments, the etch process has a wet etch rate ratio (WERR) of the TEOS layer 250a to the pad oxide layer 210 about 1.4 or less.

As described above, the liner layer 240 can be omitted in some embodiments. In these embodiments, the liner layer 240 is omitted if the TEOS layer 250 can provide some purposes of the liner layer 240, such as corner rounding and/or curing of damage on the surface of the opening 230 caused by the opening-etch process. For these embodiments, the TEOS layer 250b is formed between the substrate 200 and the dielectric layer 260b. The TEOS layer 250b, therefore, can reduce or prevent occurrences of divots formed at the top surface of the TEOS layer 250b and between the substrate 200 and the dielectric layer 260b.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A method of forming a shallow trench isolation structure, comprising the steps of:
    (a) forming an opening within a substrate and through a pad oxide formed thereover;
    (b) forming a first substantially conformal liner layer along walls of the opening;
    (c) performing a first annealing step to increase a density of the first liner layer, before depositing a second substantially conformal liner layer;
    (d) after step (c), forming the second substantially conformal liner layer comprising a tetraethoxysilane (TEOS) layer along the walls of the opening and over the annealed first liner layer without filling the opening, wherein the step of forming the second liner layer comprises a first sub-atmospheric pressure chemical vapor deposition (SACVD) process without using a processing bias;
    (e) performing a second annealing step so as to increase a density of the second liner layer, before filling the opening; and
    (f) forming a dielectric layer over the TEOS layer, the dielectric layer substantially filling the opening.

2. The method of claim 1, wherein the first SACVD process is performed at a processing pressure between about 300 mTorr to about 700 mTorr and a processing temperature between about 450° C. to about 600° C.

3. The method of claim 1, wherein the TEOS layer is formed to be about 500 Å or less.

4. The method of claim 1 wherein the annealing step comprises annealing the TEOS layer at a processing temperature of at least about 1,000° C. for at least about 30 minutes.

5. The method of claim 1, wherein the annealing step comprises annealing the TEOS layer at a processing temperature of at least about 1,100° C. for about 1 to 2 hours.

6. A method of forming a shallow trench isolation structure, comprising the steps of:
    (a) forming an opening within a substrate and through a pad oxide formed thereover;
    (b) forming a first substantially conformal liner layer along walls of the opening;
    (c) performing a first annealing step to increase a density of the first liner layer, before depositing a second substantially conformal liner layer;
    (d) after step (c), forming the second substantially conformal liner layer comprising a tetraethoxysilane (TEOS) layer along the walls of the opening and over the annealed first liner layer without filling the opening, wherein the step of forming the second liner layer comprises a first sub-atmospheric pressure chemical vapor deposition (SACVD) process without using a processing bias;

(e) performing a second annealing step so as to increase a density of the second liner layer before filling the opening; and (f) forming a dielectric layer over the TEOS layer, the dielectric layer substantially filling the opening, wherein the step of forming the dielectric layer comprises a second sub-atmospheric pressure chemical vapor deposition (SACVD) process.

7. The method of claim 6, wherein the second SACVD process comprises a flow rate ratio of $O_3$ to TEOS of about 5 or more.

8. The method of claim 6 wherein the second annealing step comprises annealing the TEOS layer by a furnace at a processing temperature of about 1,100° C. for at least about two hours.

9. The method of claim 6 further comprising the steps of:
forming a pad oxide layer over the substrate, wherein the opening is formed through the pad oxide layer; and
removing the pad oxide layer by an etch process, wherein the etch process has an etch rate ratio of the TEOS layer to the pad oxide layer of about 1.4 or less.

10. The method of claim 6, further comprising forming a tapered top edge at a top of the second liner layer on both sides of the opening, without divots therein.

11. The method of claim 6, wherein the second liner layer is formed to a thickness between about 50 Å to about 200 Å.

12. The method of claim 6, wherein step (d) uses a flow rate ratio of $O_3$ to TEOS of about 20.

13. A method of forming a shallow trench isolation structure, comprising the steps of:
(a) forming a pad oxide layer over a substrate, wherein an opening is formed through the pad oxide layer;
(b) forming an opening within a substrate and through a pad oxide formed thereover;
(c) forming a first substantially conformal liner layer along walls of the opening;
(d) performing a first annealing step to increase a density of the first liner layer, before depositing a second substantially conformal liner layer;
(e) after step (c), forming the second substantially conformal liner layer comprising a tetraethoxysilane (TEOS) layer along the walls of the opening and over the annealed first liner layer without filling the opening, wherein the step of forming the second liner layer comprises a first sub-atmospheric pressure chemical vapor deposition (SACVD) process without using a processing bias;
(f) performing a second annealing step so as to increase a density of the second liner layer, before filling the opening;
(g) forming a dielectric layer over the TEOS layer, the dielectric layer substantially filling the opening, wherein the step of forming the dielectric layer comprises a second sub-atmospheric pressure chemical vapor deposition (SACVD) process; and
(h) removing the pad oxide layer by an etch process, wherein the etch process has an etch rate ratio of the TEOS layer to the pad oxide layer of about 1.4 or less.

14. The method of claim 13, wherein step (h) includes forming a tapered top edge at the top of the second liner layer on both sides of the opening, without divots therein.

15. The method of claim 13, wherein the second liner layer is formed to a thickness between about 50 Å to about 200 Å.

16. The method of claim 13, wherein step (e) uses a ratio of the flow rate ratio of $O_3$ to TEOS of about 20.

* * * * *